United States Patent
Chan

(10) Patent No.: US 10,228,912 B2
(45) Date of Patent: Mar. 12, 2019

(54) TUNABLE TUNNEL DIODE-BASED DIGITIZED NOISE SOURCE

(71) Applicant: QuintessenceLabs Pty Ltd., Deakin ACT (AU)

(72) Inventor: Raymond Chan, Deakin (AU)

(73) Assignee: QuintessenceLabs Pty Ltd., Deakin (AU)

( * ) Notice: Subject to any disclaimer, the term of this patent is extended or adjusted under 35 U.S.C. 154(b) by 0 days.

(21) Appl. No.: 15/469,323

(22) Filed: Mar. 24, 2017

(65) Prior Publication Data
US 2018/0067723 A1 Mar. 8, 2018

Related U.S. Application Data

(60) Provisional application No. 62/383,975, filed on Sep. 6, 2016.

(51) Int. Cl.
*G06F 7/58* (2006.01)
*G06N 99/00* (2010.01)
(Continued)

(52) U.S. Cl.
CPC ........... *G06F 7/588* (2013.01); *G06N 99/002* (2013.01); *H02M 11/00* (2013.01); *H03K 17/74* (2013.01)

(58) Field of Classification Search
CPC ............................................. G06F 7/58–7/588
(Continued)

(56) References Cited

U.S. PATENT DOCUMENTS 4,853,884 A * 8/1989 Brown ..................... G06F 7/588
 331/78
7,511,586 B2 * 3/2009 Mattisson .............. H03B 29/00
 331/78
(Continued)

FOREIGN PATENT DOCUMENTS

| JP | 08227682 A | 9/1996 |
|---|---|---|
| WO | 03040854 A2 | 5/2003 |
| WO | 2015168798 A1 | 11/2015 |

OTHER PUBLICATIONS

R. Bernardo-Gavito, I. Ethem Bagci, J. Roberts et al., "Extracting random numbers from quantum tunnelling through a single diode," ArXiv:1706.07348, 2017.*

(Continued)

*Primary Examiner* — Matthew D Sandifer
(74) *Attorney, Agent, or Firm* — Kilpatrick Townsend & Stockton LLP

(57) ABSTRACT

A tunable tunnel diode based digitized noise source includes a digitized noise source for producing a sequence of random digital signals. The digitized noise source includes a tunnel diode for providing a current signal that includes quantum shot noise. The digitized noise source can also include a current-to-voltage converter coupled to the tunnel diode for converting the current signal to a voltage signal, a filtering and amplification circuit coupled to the current-to-voltage converter for producing an amplified voltage signal, and a digitization circuit for converting the amplified voltage signal into the sequence of digital signals that represents random bits. The tunable tunnel diode based digitized noise source further includes an entropy estimator coupled to the output of the digitization circuit for estimating an entropy of the sequence of digital signals and for providing a feedback bias voltage to the tunnel diode.

17 Claims, 8 Drawing Sheets

(51) Int. Cl.
*H02M 11/00* (2006.01)
*H03K 17/74* (2006.01)

(58) Field of Classification Search
USPC .................................................. 708/250–256
See application file for complete search history.

(56) References Cited

U.S. PATENT DOCUMENTS

2015/0227344 A1* 8/2015 Park ........................ G06F 7/588
706/52
2016/0062735 A1* 3/2016 Wilber .............. G06F 17/30654
706/46

OTHER PUBLICATIONS

R.Bernardo-Gavito, I.Ethenn Bagci, J.Roberts et al., "Extracting random numbers from quantum tunnelling through a single diode," ArXiv, 1706.07348, 2017 (Year: 2017).*

QuintessenceLabs, "Quantum 'Tunneling' Away from Cyber Criminals", Feb. 2018, retrieved from https://globenewswire.com/news-release/2018/02/14/1348265/0/en/Quantunn-Tunneling-Away-from-Cyber-Criminals.html (Year: 2018).*

Ma, et al., "Quantum random number generation", npj Quantum Information, vol. 2, Jun. 28, 2016, 9 pages.

PCT/AU2017/000184, "International Search Report and Written Opinion", dated Nov. 8, 2017, 10 pages.

\* cited by examiner

TUNABLE TUNNEL DIODE-BASED DIGITIZED NOISE SOURCE

CROSS-REFERENCES TO RELATED APPLICATIONS

This application claims priority to U.S. Provisional Patent Application No. 62/383,975, filed Sep. 6, 2016, which is commonly owned and incorporated in its entirety herein by reference.

BACKGROUND OF THE INVENTION

In cryptosystems and other cryptography applications, the strength of security is related to the quality of the cryptographic keys. Random number generators can generate streams of random bits, which can be used for cryptographic keys. The best cryptographic keys are a sequence of completely random bits, which are independent and identically distributed (IID), meaning that each bit value has an equal probability of occurring and all values are mutually independent. Despite the fact that many incidents of security compromise are due to human nature, it is paramount that cryptographic keys are of the highest quality to deter any attempt of security beach from the lowest level, the level on which all security of a cryptosystem relies. The entropy source which generates the random bits for cryptographic keys must, therefore, be of the highest quality and capable of producing full entropy bits.

A potential security concern in cryptosystems and other cryptography applications is when the cryptographic keys are not truly random. In one example, a deterministic random bit generator (DRBG) can produce a pseudo-random sequence of bits using a mathematical algorithm and secret initial seed value. For example, secure shell key generation (ssh-keygen) uses pseudo-random bits generated out of a deterministic algorithm as keys for communications. The risk is that a pseudo-random sequence can be reproduced again given exactly the same initial conditions. Therefore, improved random number generators are highly desirable.

BRIEF SUMMARY OF THE INVENTION

Embodiments of the invention provide a digitized noise source which is capable of producing random bits at high-speed. The source of randomness is derived from the quantum mechanical phenomenon of tunneling. Quantum tunneling is one of the fundamental processes that occurs in nature that is completely random. It is a sub-atomic phenomenon that relies on internal structure and properties of the building materials, and is relatively robust against external environment. The bandwidth of random signals generated out of quantum tunneling in semi-conductors, for instance, can reach hundreds of mega Hertz, speeds that exceed competing technologies, for example, ring oscillation and avalanche break down.

In embodiments of the invention, the digitized noise source can form part of an entropy source which itself can produce a sequence of full entropy random bits. The entropy source, in turn, can be a subcomponent of a random number generator that can, for example, produce cryptographic key material for cryptosystems and other cryptographic applications.

According to some embodiments of the invention, a tunable tunnel diode based digitized noise source includes a digitized noise source for producing a sequence of random digital signals. The digitized noise source includes a tunnel diode for providing a current signal that includes the statistical properties of quantum shot noise and a current-to-voltage converter coupled to the tunnel diode for converting the current signal to a voltage signal. The digitized noise source also includes a filtering and amplification circuit coupled to the current-to-voltage converter for producing an amplified voltage signal, and a digitization circuit for converting the amplified voltage signal into the sequence of digital signals that represents random bits. The tunable tunnel diode based digitized noise source further includes an entropy estimator coupled to the output of the digitization circuit for estimating an entropy of the sequence of digital signals. The tunable tunnel diode based digitized noise source can also include a health checker coupled to the output of the digitization circuit for determining if the digitized noise source meets performance specification. The tunable tunnel diode based digitized noise source further includes controller logic for storing in tables applied bias voltage versus entropy estimates and health test results. The control logic uses the lookup tables and digital logic to select a feedback voltage signal value. A feedback bias voltage can be applied to the tunnel diode to optimize the entropy and operational performance.

According to some embodiments of the invention, a digitized noise source device for producing a sequence of random digital signals includes a tunnel diode for providing a current signal that includes quantum shot noise, and a current-to-voltage converter coupled to the tunnel diode for converting the current signal to a voltage signal. The digitized noise source device also includes a filtering and amplification circuit coupled to the current-to-voltage converter for producing an amplified voltage signal, and a digitization circuit for converting the amplified voltage signal into digital signals that represent a sequence of random bits.

According to some embodiments of the invention, a noise source device for producing a sequence of random digital signals includes a tunnel diode for providing a current signal that includes quantum shot noise.

According to some embodiments of the invention, a method for providing a digitized noise signal includes providing a tunnel diode and applying a bias voltage to the tunnel diode for providing a tunneling current signal that includes quantum shot noise. The method also includes converting the current signal to a voltage signal, filtering and amplifying the voltage signal and converting the voltage signal into the sequence of digitized noise signals that represents random bits.

These and other embodiments of the invention along with many of its advantages and features are described in more detail in conjunction with the text below and attached figures.

TERMS

Figure 1:
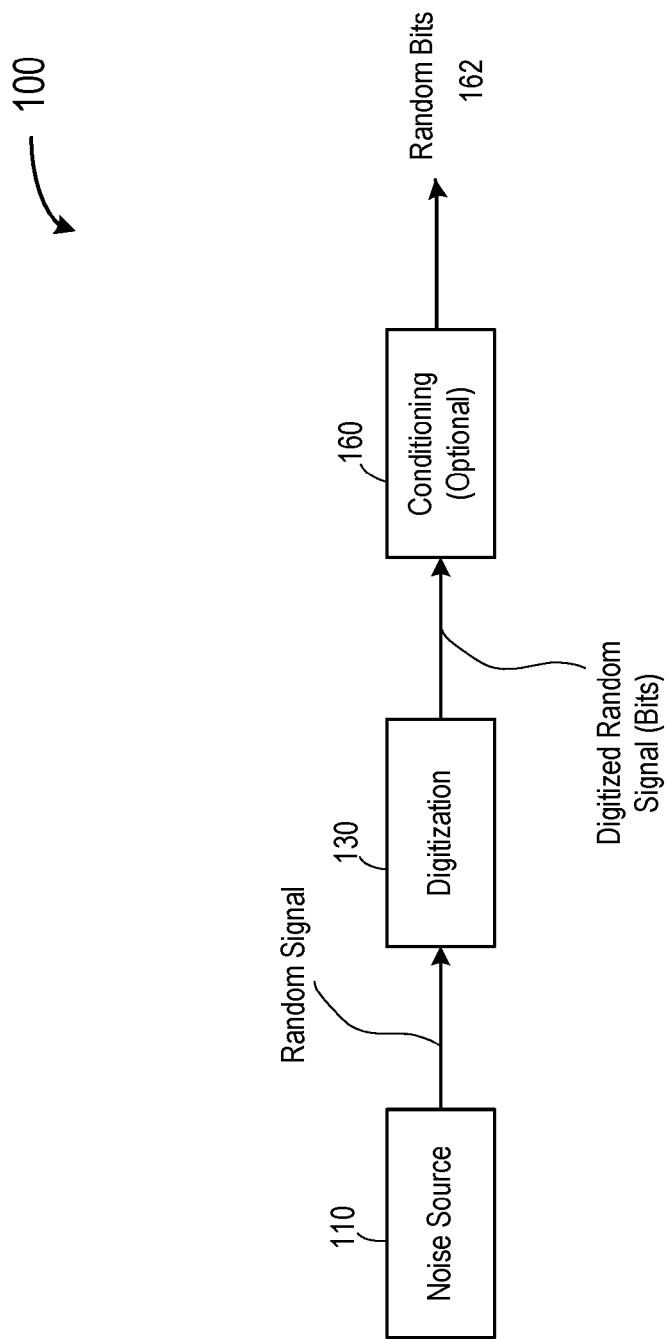
FIG. 1 shows a functional component-level signal flow diagram of an entropy source according to some embodiments of the invention.

A cryptosystem can include a cryptography module that uses one or more cryptographic algorithms to implement a security service.

A cryptographic key can be a sequence of bits used by a cryptographic algorithm.

An independent and identically distributed (IID) sequence of bits may refer to a sequence of bits where each element of the sequence has an equal probability of occurring and all values are mutually independent.

Entropy may refer to the measure of uncertainty, unpredictability or randomness of a system.

A full-entropy sequence of bits may be effectively indistinguishable from independent and identically distributed bits.

A random bit generator may refer to a device or algorithm that outputs a random sequence of full-entropy bits.

A non-deterministic random bit generator may refer to a random bit generator that has access to a properly-functioning entropy source and produces a full-entropy bit sequence. (Ref: NIST SP 800 90C ($2^{nd}$ Draft)).

An entropy source may refer to a device that has access to a noise source and outputs a random sequence of full-entropy bits. (Ref: NIST SP 800 90B ($2^{nd}$ Draft)).

A noise source may refer to a component of an entropy source that contains non-deterministic entropy-producing activity.

A digitization component may refer to a component of an entropy source that converts the output of a noise source to a sequence of bits.

A conditioning component may refer to a component of an entropy source and may include the implementation of an algorithm that reduces the bias and/or increases the entropy density of the output bits.

A diode may refer to a two-terminal electronic component that allows current flow primarily in one direction.

A Poisson distribution may refer to a discrete probability distribution that describes a number of independent discrete events occurring in a fixed time-interval.

Shot noise (or Poisson noise) may refer to noise that arises in systems described by a Poisson distribution whereby a random number of discrete events occurs in a given time-interval.

DETAILED DESCRIPTION OF THE INVENTION

In embodiments of the present invention, a tunnel diode electronic component is used to produce an electric current that exhibits shot noise. The noise produced by the tunnel diode is the source of non-deterministic, entropy-producing activity. This electrical current is converted to a voltage and then filtered and amplified before being digitized. The entropy of the digitized signal is estimated. Health test algorithms are applied to the digitized signal. Controller logic component stores the entropy estimate and health test results. The control logic uses the lookup tables and digital logic to select a feedback voltage signal value. A feedback signal may be sent to the tunnel diode to optimize the entropy of the system. In some embodiments, the output is a sequence of random bits.

Embodiments of the present invention are comprised of electronic components. These components can be independent electronic components on a discrete circuit or integrated components in an integrated circuit. In the latter case, embodiments of this invention can have reduced form-factor, power, and cost compared with the former.

Embodiments of the present invention can include a cryptosystem. In cryptography, a cryptosystem consists of cryptographic algorithms and cryptography keys that are used to protect digital information. A cryptosystem can require random bits, for example, randomly generated cryptographic keys, etc.

Embodiments of the present invention can include an entropy source. A cryptographic entropy source is a device that can produce a sequence of full-entropy, random bits. Full-entropy, bits are independent and identically distributed (IID) and are indistinguishable from true-random bits. The National Institute of Standards and Technology recommendations a construction of an entropy source (Ref NIST SP 800 90B (2nd Draft)), which includes: a noise source, a digitizer and an (optional) conditioning component. FIG. 1 shows a functional component-level signal flow diagram of an entropy source.

FIG. 1 shows a functional component-level signal flow diagram of a random number generator according to certain embodiments. As shown in FIG. 1, random number generator 100 includes a noise source 110, a digitizer 130, and an (optional) conditioning component 160, consistent with the recommendation of the construction of an entropy source from the National Institute of Standards and Technology recommendations (Ref NIST SP 800 90B (2nd Draft)).

As illustrated in FIG. 1, random number generator 100 includes a noise source 110. Noise source 110 is configured for producing a non-deterministic, entropy-producing activity. This activity is converted into a measurable randomly-varying signal, for example an electric voltage or an electric current. The output values of the noise source, random signal, can be either discrete or continuous (digital or analog).

Random number generator 100 includes a digitization component 130, which is used to convert the output from the noise source into digital values (bits), i.e., digitized random signal bits. An example of a digitizer includes an analogue-to-digital (ADC) converter.

Random number generator 100 can also include a conditioning component 160. In FIG. 1, conditioning component 160 is an implementation of a deterministic algorithm, which acts on the digitized signal to reduce the bias and/or increase the entropy density of the output bits. The output bits 162 from a well-constructed conditioning component are full-entropy, uniformly distributed and random.

Embodiments of the present invention can include a random number generator. The cryptographic entropy source may itself be a subcomponent of a random bit generator (RBG) (Ref NIST SP 800 90C (2nd Draft)). A random bit generator can use the full-entropy random bit sequence, which is produced by its internal entropy source component, to produce cryptographic keys for cryptosystems and other cryptographic applications.

In embodiments of the present invention, noise source 110 can include electric current that can exhibit shot noise. Shot noise can be used as the entropy producing activity in a cryptographic noise source. Shot noise arises in systems described by a Poisson distribution whereby a random number of discrete events occurs in a given time-interval. Shot noise (or Poisson noise) describes the fluctuations in the number of events occurring per time-interval. Shot noise is present in electronics because electrons are discrete fundamental energy packets. Since electric current describes the number of electrons per second, an electric current exhibits shot noise arising from the fluctuations in the number of electrons per second. In addition to this, when electrons in an electric current are randomly selected (partitioned) to tunnel through a barrier, this random selection creates another level of fluctuation in the number of electronics of an electric current that already exhibit shot noise. Because this fluctuation arises from random partitioning, it is referred to as partition noise which has a lot of common characteristics as shot noise. In an electronic system, this partition noise is sometimes called quantum shot noise. The term "shot noise" in the rest of this document includes all of these noises (i.e., shot noise, partition noise, and quantum shot noise). Shot noise may be dominant when the finite number of particles that carry energy (such as electrons in an electronic circuit or photons in an optical device) is sufficiently small so that uncertainties due to the Poisson distribution, which describes the occurrence of independent random events, are of significance. In the case when the size of finite number of particles is large, the random selection in partitioning can make this shot noise significant.

Shot noise can be observed in electronic components, for example, electronic diodes. A diode is a two-terminal electronic component that allows current flow primarily in one direction. A semiconductor diode consists of p-type and n-type semiconductors placed in junction with each another. A p-n diode is a type of semiconductor diode based upon the p-n junction, which is an interface between p-type and n-type semiconducting layers. N-type semiconductors have a larger electron-to-hole concentration and p-type semiconductors have a larger hole-to-electron concentration. The process of doping intentionally introduces impurities into the semiconducting layers for the purpose of changing its electrical properties, e.g. changing the electron and hole concentrations of the semiconductor. The depletion layer is a region in a semiconductor where no mobile charge carriers are present. The depletion layer acts like a potential barrier that opposes the flow of electrons from n-side and holes from p-side. A bias voltage refers to a voltage applied across a p-n junction. For forward bias, there is a positive difference between the p-type and n-type semiconducting layers. For reverse bias, there is a negative voltage difference between the p-type and n-type semiconducting layers.

Figure 2:
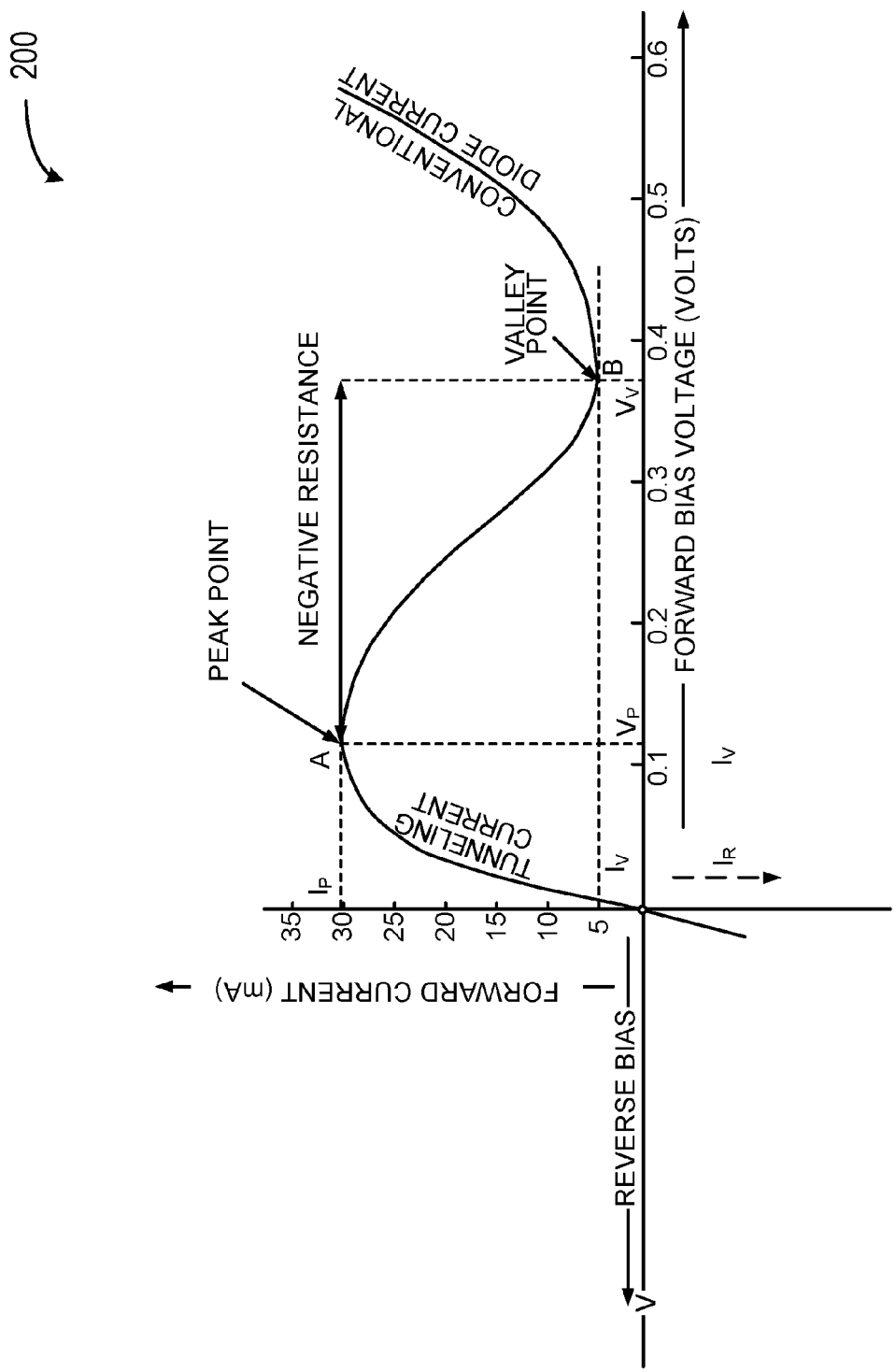
FIG. 2 shows an example of a representative characteristic voltage-current curve of tunnel diodes.

In embodiments of the present invention, noise source 110 in FIG. 1 can include a tunnel diode. FIG. 2 shows an example 200 of a characteristic voltage-current curve of a tunnel diode. Tunnel diodes have a heavily doped p-n junction that results in the depletion layer width being very small. For a small applied forward bias voltage, electrons can tunnel through the very narrow p-n junction barrier, for example, about 10 nm (100 Å) wide. The heavy doping results in an overlap in energy between the conduction band electron states on the n-side and the valence band hole states on the p-side.

In FIG. 2 of the horizontal axis is the applied voltage on the tunnel diodes, and the vertical axis is the current flowing through the tunnel diode. It can be seen that the application of a forward bias voltage results in a peak current Ip at a bias voltage Vp as shown by peak point A in FIG. 2. A further increase of voltage causes a decrease in current, corresponding to a negative resistance region. Under normal forward bias operation, as voltage begins to increase, electrons can tunnel through the very narrow p-n junction barrier and fill electron states in the conduction band on the n-side which become aligned with empty valence band hole states on the p-side of the p-n junction. As the bias voltage increases further, these states become increasingly misaligned and the current drops. This is called negative resistance because current decreases with increasing voltage until the current reaches a valley point B. As voltage increases yet further beyond a valley bias voltage Vv, the diode begins to operate as a normal diode where minority current starts to dominate as the charge carriers travelling across the p-n junction, and the tunneling current through the p-n junction barrier stops. High speed electronic circuits often use a tunnel diode in the negative resistance region.

As described above, in the low forward bias region and reverse bias region of a tunnel diode, the only current-flow mechanism is tunneling. Quantum tunneling or tunneling refers to the quantum mechanical phenomenon where an electron tunnels through a potential energy barrier of the junction that it classically could not surmount. The bias voltage required in this condition is so low that electronics under the weak electric field would not get enough momentum to cause ionization upon impact to sustain conduction. That is, current flow can only be possible due to quantum tunneling effect. Practical tunnel diodes operate at a few tenths of milli-amperes and a few tenths of a volt, making them low-power devices. A tunnel diode is characterized by low transmission in all transport channels and the random nature of electrons tunneling through a barrier; therefore the electron flow can be described by a Poisson process.

Furthermore, tunnel diodes are suitable as a quantum noise source because they do not exhibit classical electron avalanche noise. The avalanche process occurs when carriers in the transition region are accelerated by high electric field to energies sufficient to create mobile or free electron-hole pairs via collisions with bound electrons (an avalanche). This avalanche process can be present in other types of diodes, e.g., avalanche and Zener diodes. In contrast, the tunnel diode is operating under very low voltage and low current conditions that renders this avalanche process impossible. The only plausible explanation for the conduction of tunnel diode at such a low voltage is quantum tunneling.

Some embodiments make use of small bias voltages around the zero applied voltage. In FIG. 2, for example, the tunneling current increases linearly with bias voltage when the forward bias voltage is less than 50 mV. In some embodiments, the tunneling diode bias voltage can vary between 0 V and 60 mV, corresponding to the tunneling current varying between 0 to 22 mA. In alternative embodiments, other bias conditions for tunneling can also be used. For example, conduction by tunneling current also takes place in reverse bias.

In embodiments of the invention, for quantum noise generation, the tunneling diode is biased at low voltage and low current conditions. These embodiments offer advantages such as lower power consumption. In comparison, noise generation using, for example, avalanche often requires much higher bias voltages to generate large noise, in excess of 5V.

Historically, tunneling diodes have been used in high frequency communication circuits, such as satellite communication. However, modern high-speed integrated circuits have largely replaced tunnel diodes in high speed circuit applications. Embodiments of the present invention have identified a new utility of tunnel diodes.

Figure 3:
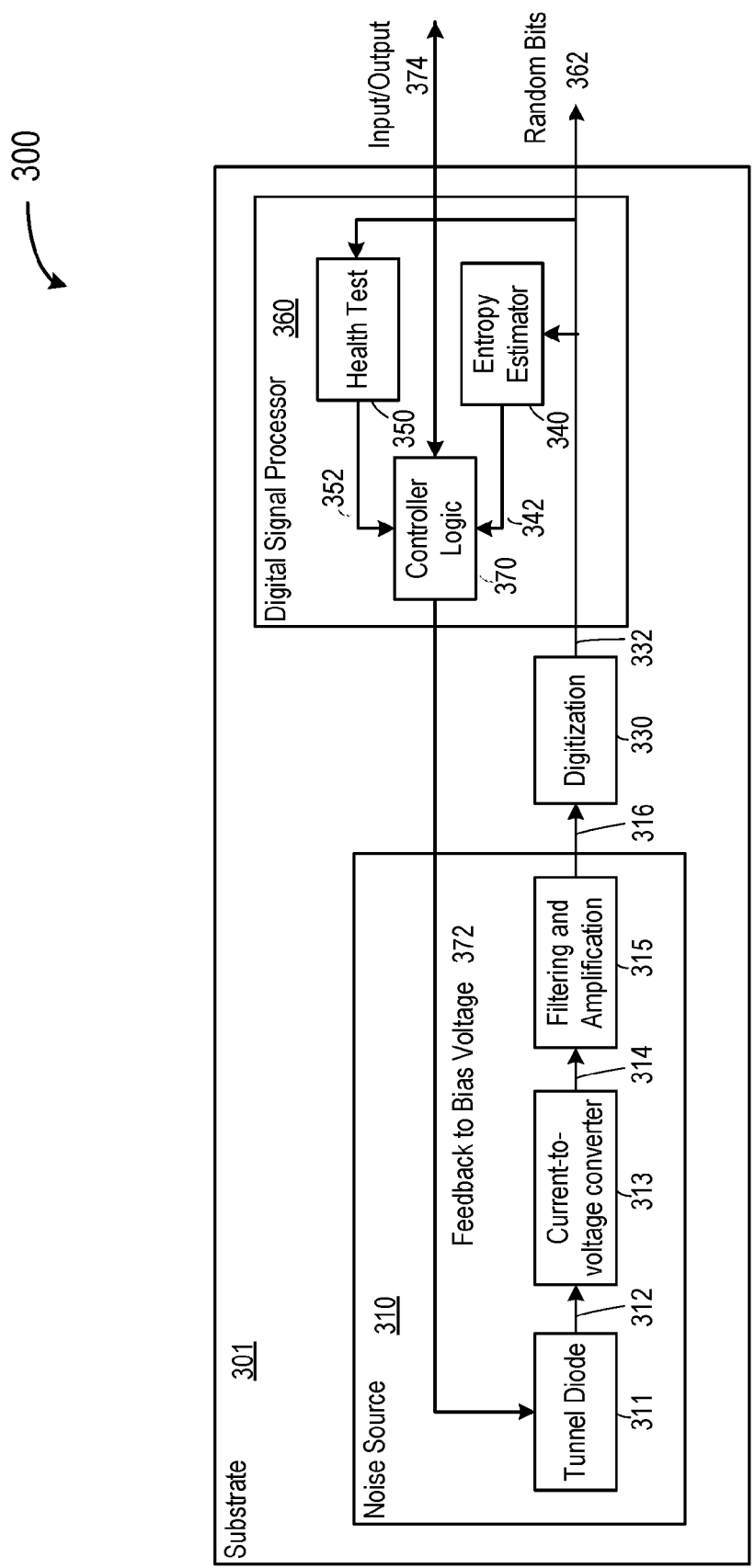
FIG. 3 is a block diagram illustrating a tunable tunnel diode-based digitized noise source (random number generator) according to some embodiments of the invention.

FIG. 3 is a block diagram illustrating a random number generator according to embodiments of the invention. As shown in FIG. 3, the random number generator 300 includes a tunable tunnel diode-based digitized noise source. Random number generator 300 has a digitized noise source device for producing a sequence of random digital signals. The digitized noise source device includes noise source 310 and a digitization circuit 330. Noise source 310 includes a tunnel diode 311, a current-to-voltage converter 313 and a filtering and amplification circuit 315. The tunnel diode generates a current signal 312 that includes quantum shot noise. The current-to-voltage converter 313 may be coupled to the tunnel diode and converts the current signal to a voltage signal 314. The filtering and amplification circuit 315 may be coupled to the current-to-voltage converter and produces an amplified voltage signal 316. In some embodiments, tunnel diode 311 and current-to-voltage converter 313 may be combined in the same circuit block. In certain other embodiments, the tunnel diode 311 and the current-to-voltage converter 313 may be discrete components. Digitization circuit 330 is configured for converting the amplified voltage signal 316 into digital signals that represent a sequence of random digital bits 332. The random number generator can also include an entropy estimator 340 coupled to the output of the digitization circuit 332. The random number generator can further include a health checker 350 also coupled to the output of the digitization circuit 332. The random number generator can further include random bit output 362 also coupled to the output of the digitization circuit 332. The output from the entropy estimator 342 can further be coupled to controller logic 370. The output from the health test 350 can further be coupled to the control logic. The controller logic can further output a feedback bias voltage 372 to the tunnel diode 311. The controller logic 370 can further be externally communicated with using an input/output 374 communication channel. In some embodiments, health checker 350 and entropy estimator 340 and the controller logic 370 can be included in a digital signal processor component 360. These components are described in more detail below.

As shown in FIG. 3, the electronic components described above are connected by electrically conducting signal paths. The electronic components may be mounted on a substrate 301 that can be a printed circuit board or an integrated circuit chip, for example. In one embodiment, the digitization and the digital signal processor components can be on the same substrate as the other electronic components. This so-called mixed-signal circuit could be implemented, for example, on an application-specific integrated circuit (ASIC). In another embodiment, either or both the digitization and the digital signal processor component could be separate from the substrate. In certain embodiments, one or more components of FIG. 3 may be implemented as an System on a Chip (SoC).

The electronic components can, for example, be independent electronic components or integrated components. The circuit can be a discrete circuit or an integrated circuit, or a mixed-signal integrated circuit.

As described above, a tunnel diode that is biased in the tunneling region can produce a current that can exhibit noise (shot noise). A correctly-biased tunnel diode is functionally equivalent to a current source that includes the shot noise representing a non-deterministic activity.

The tunnel diode may be either reverse or forward biased as discussed above in connection with FIG. 2. In some embodiments, the tunnel diode is forward biased, and the applied forward bias voltage is below the peak current voltage. The bias voltage may be varied to change the amount of randomness of the bits output by the invention. A signal from the entropy estimator component can be recorded in the controller logic component and used in a feedback loop to adjust the bias voltage.

Figure 4:
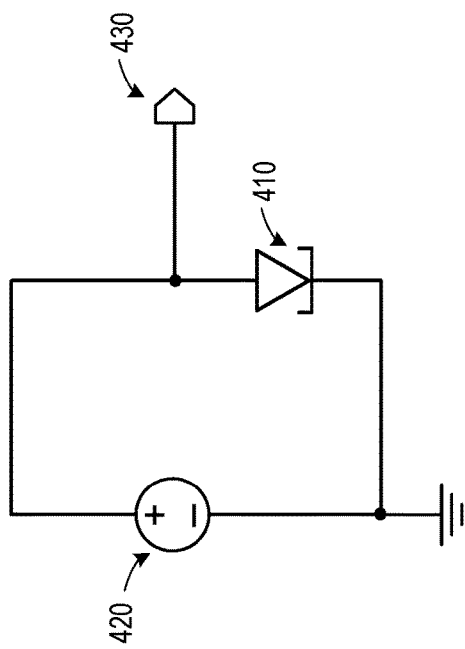
FIG. 4 is a schematic diagram illustrating a current-to-voltage convertor circuit according to some embodiments of the invention.

FIG. 4 is a schematic diagram illustrating a circuit block 400 that includes a tunnel diode and a current-to-voltage convertor circuit according to some embodiments of the present invention. As shown in FIG. 4, circuit block 400 includes a tunnel diode 410 and a variable DC power supply 420. Circuit block 400 converts the current from the tunnel diode into a voltage signal at an output terminal 430. Thus, FIG. 4 shows a circuit effectively measures the voltage across the tunnel diode.

Figure 5:
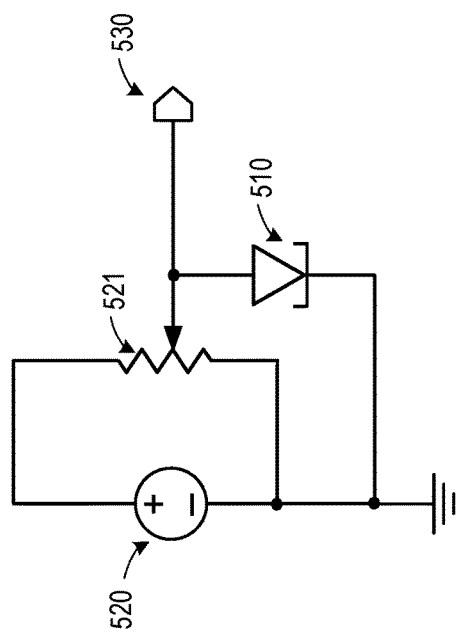
FIG. 5 shows an example of a functionally equivalent circuit to FIG. 4 according to some embodiments of the invention.
Figure 6:
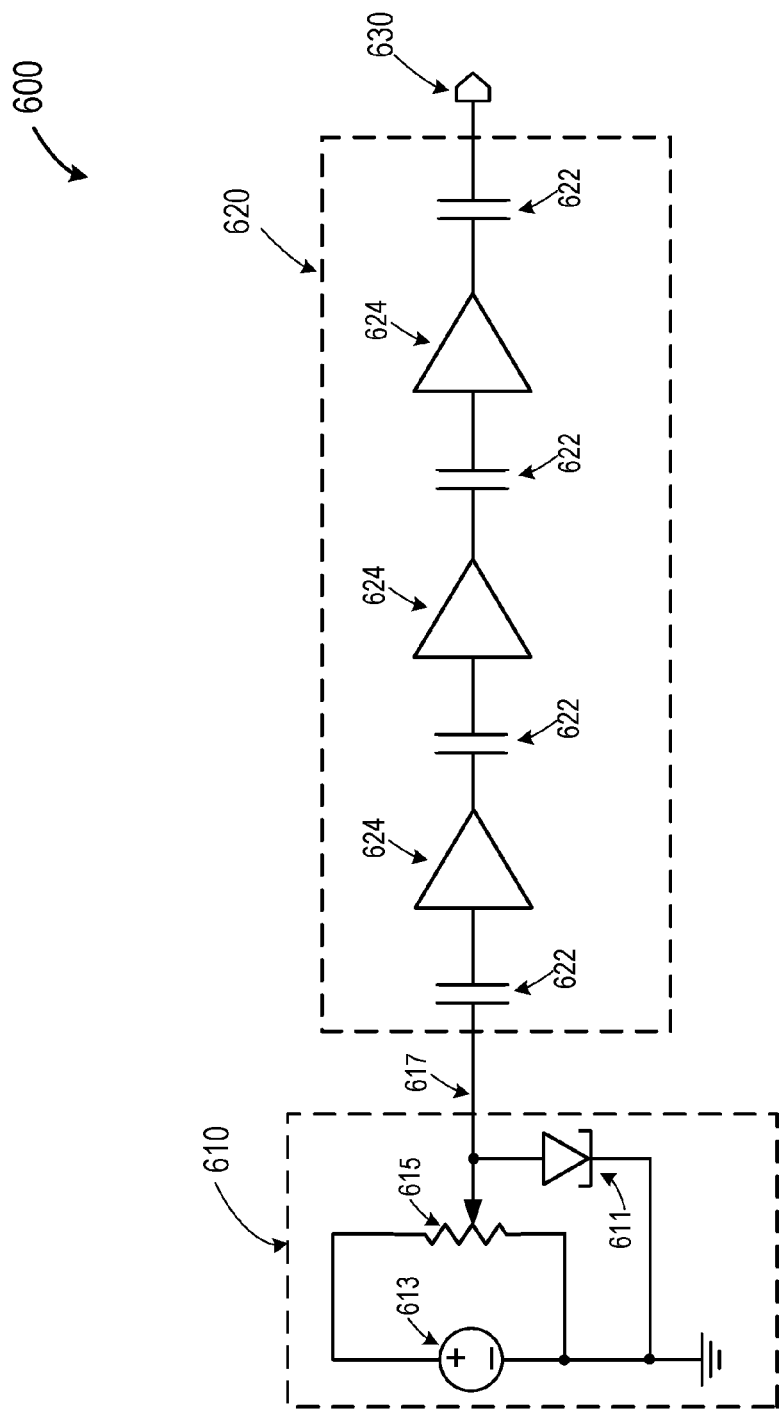
FIG. 6 shows a schematic diagram of the filter and amplifier according to some embodiments of the invention.

FIG. 5 is a schematic diagram illustrating an example of a functionally equivalent circuit to FIG. 4. Circuit block 500 converts the current from the tunnel diode into a voltage signal at an output terminal 530. As shown in FIG. 5, circuit block 500 includes a tunnel diode 510, a constant DC power supply 520, and a variable resistor 521. Compared with circuit block 400 in FIG. 4, in circuit block 500, constant DC power supply 520 and variable resistor 521 replace the functional role of the variable DC power supply 420 in FIG. 4. FIG. 5 is configured with constant DC power supply 520, which can have better noise quality compared with a variable power supply in FIG. 4. Further, variable resistor 521 can be more readily adjusted with a feedback signal from the entropy estimator component, as described below. Circuit blocks 400 and 500 can be implemented in a number of different ways. For example, they can be implemented using an application-specific integrated circuit (ASIC) on a printed circuit board or an integrated circuit chip FIG. 6 is a schematic diagram illustrating a noise source 600 according to some embodiments of the present invention. As shown in FIG. 6, noise source 600 includes a tunnel diode and current to voltage converter component 610 and a filter and amplifier component 620. Tunnel diode and current to voltage converter component 610 is similar to circuit block 500 in FIG. 5, and includes a tunnel diode 611, a constant DC power supply 613, and a variable resistor 615. The output of the voltage converter component 610 is a voltage signal 617 representing a voltage across tunnel diode 611 that includes a quantum noise.

In FIG. 6, filter and amplifier component 620 includes multiple capacitors 622 and multiple amplifiers 624. The filter and amplification component is comprised of electronic components that filter and amplify the electronic signal from the current-to-voltage component. A DC-block capacitor can remove the DC component of the signal. The filtering capacitors can also remove unwanted noise components. For example electronic 1/f or flicker noise can be removed with a high-pass filter. In another example, filters can include high-pass, low-pass and band-pass filters, etc. The purpose of amplification is to increase the signal size sufficiently to be digitized. Amplifiers can include low-noise and power amplifiers, etc. A combination of a number of different amplifiers and filters can be used. The filter and amplification circuit can be implemented in a number of different ways. The output of noise source 600 is a voltage signal 630 that includes quantum noise components at an output terminal.

In reference to FIG. 3, the digitization component 330 in FIG. 3 is used to convert the output signal 316 from noise source 310 into digitized values or bits 332. For example, output signal 316 from noise source 310 in FIG. 3 is an analog voltage signal that includes quantum noise components, similar to output signal 630 from noise source 600 in FIG. 6. In embodiments of the invention, the digitization component 330 in FIG. 3 can include an analogue-to-digital converter (ADC) to convert analog signals into digital signals, in which a string of digital bits represents an analog signal 316. Depending on the embodiments, the digitization component can be implemented using conventional analogue-to-digital converters with a desired sampling rate, accuracy, and resolution. For example, an ADC can include reference voltages that are used to compare with the incoming voltage from the current to voltage converter and convert the voltage into binary information based on if the voltage is below or above a certain level. In other embodiments, the same voltage signal may indicate multiple levels and thus states and provide digital information that is more than just one bit at a time. Further, digitization component 330 can be configured to match the bandwidth of the noise generator. As described above, the bandwidth of random signals, generated out of quantum tunneling in semi-conductors for instance, can reach hundreds of mega Hertz. In these cases, digitization component 330 can include very high speed analogue-to-digital converters.

In FIG. 3, after the digitization component, the bits are input into a digital signal processor component 360, which can include a central processing unit (CPU) or a field-programmable gate array (FPGA), etc. In some embodiments, digital signal processor component 360 can include entropy estimator 340, health checker 350, and controller logic 370. In certain embodiments, the entropy estimator 340 and/or the health checker 350 and/or controller logic 370 or portions of these components may be implemented using instructions executed on the digital signal processor component 360. In certain embodiments, such instructions may be stored in a medium such as memory and/or computer readable medium, and loaded from such a medium into the digital signal process 360 for execution. Momentarily referring to FIG. 8, in certain embodiments, the digital signal processor component 360 may be similar to the central processor 830 of FIG. 8. Furthermore, the memory and/or computer readable medium may be implemented using one or more of the system memory 820 and/or the storage device 890.

The entropy estimator component 340 is configured to estimate the entropy of the digitized signal 332 from the noise source 310. Entropy is defined relative to one's knowledge of an experiment's output prior to observation, and reflects the uncertainty associated with predicting its value—the larger the amount of the entropy, the greater the uncertainty in predicting the value of an observation. In some embodiments, entropy estimator 340 is configured to estimate the min-entropy, which measures the difficulty of guessing the most likely output of the entropy source. In cryptography, the unpredictability of secret values (such as cryptographic keys) is essential. The probability that a secret is guessed correctly in the first trial is related to the min-entropy of the distribution of the output of the entropy source. The min-entropy is closely related to the negative logarithm of the maximum probability using the optimal guessing strategy.

The min-entropy of an independent discrete random variable X that takes values from the set $A=\{x_1, x_2, \ldots, x_k\}$ with probability $Pr(X=x_i)=p_i$ for $i=1, \ldots, k$ is defined as $$H = - \min_{0 \leq i \leq k} (-\log_2 p_i),$$

$$= -\log_2 \max_{0 \leq i \leq k} p_i.$$

If X has min-entropy H, then the probability of observing any particular value for X is no greater than $2^{-H}$. The maximum possible value for the min-entropy of a random variable with k distinct values is $\log_2 k$, which is attained when the random variable has a uniform probability distribution, i.e., $p_1=p_2= \ldots =_{pk}=1/k$.

Even though the above description of entropy estimation is based on min-entropy, in other embodiments, alternative methods of entropy estimation can also be used. Further examples of entropy estimation algorithms that can be used to estimate the min-entropy can be found, for example, in Ref NIST SP 800-90B (2nd Draft).

The resulting entropy estimate 342 can be output to the controller logic 370. The controller logic can store the entropy estimate in a table that records the entropy estimate versus the applied bias voltage. Using the entropy estimator and/or the results table, it is possible to optimize the entropy of the noise source by feedback to the bias voltage 372 applied to the tunnel diode 311.

FIG. 3 also shows a feedback path 372 from controller logic 370 to tunnel diode 311. The result from entropy estimation can be used to select the bias voltage for the tunnel diode in the noise source. In some embodiments, controller logic 370 can include a lookup table of tunnel diode bias voltage vs. entropy measured by the entropy estimator. Table I below is an example of a lookup table of tunnel diode bias voltage vs. entropy according to an embodiment of the invention. In Table I, $V_i$ is the tunnel diode bias voltage and $e_i$ is the entropy of the generated random bits, where i is an integer between 1 and N.

TABLE I

| Tunnel Diodes Bias Voltage | Entropy |
| --- | --- |
| $V_1$ | $e_1$ |
| $V_2$ | $e_2$ |
| $V_3$ | $e_3$ |
| $V_4$ | $e_4$ |
| ... | ... |
| ... | ... |
| $V_N$ | $e_N$ |

In some examples, the lookup table can be generated in the factory and pre-loaded in the system using the input/output communication channel 374. When the system is turned on, the lookup table can be used to calibrate the tunnel diode performance. During system operation, the lookup table can be used to check that the noise source is performing adequately. In some embodiments, the system can be configured to include real-time adjustment of the bias voltage to obtain the desired noise performance. In certain embodiments, the lookup table is stored in a memory, such as system memory 820 of FIG. 8.

In FIG. 3, health test component 350 can assess if the tunneling diode is functioning correctly by applying heath test algorithms to the digitized noise source output 332. The results from the health test algorithms can be output 352 to the controller logic. In the controller logic 370, the output of each health test algorithm can be stored in a lookup table together with the corresponding bias voltage. Also, stored in the controller logic 352 are operating conditions for which the tunnel diode is deemed to be operating correctly. In some embodiments, the method also includes generating a lookup table listing tunnel diodes bias voltage versus the output of the health test algorithms applied to the sequence of digital signals. For example, the health test lookup tables can be generated in the factory and pre-loaded in the system using the input/output communication channel 374, and the tables can be used during system startup to verify the functionality of the system. The results from the health tests can be used to restrict the range of bias voltages applied to the tunneling diode 372. A correctly functioning tunnel diode can produce shot noise, where the digitized noise samples have an approximately normal distribution with an approximately white power spectrum across the bandwidth of the noise-producing process. Examples of heath test algorithms can include: i) a discrete Fourier transform (DFT) that converts the digitized noise from the time domain to a representation in the frequency domain, where, for example, the gradient of the resulting power spectrum can be estimated, and ii) a Normality test algorithm, for example the Jarque-Bera test, which is a goodness-of-fit test of whether the digitized noise has the skewness and kurtosis matching a normal distribution.

Table II below is an example of a lookup table of tunnel diode bias voltage vs. health test algorithm results according to an embodiment of the invention. In Table II, $V_i$ is the tunnel diode bias voltage and $h_i$ is the health test result of the generated random bits, where i is an integer between 1 and N.

TABLE II

| Tunnel Diodes Bias Voltage | Health Test Result |
| --- | --- |
| $V_1$ | $h_1$ |
| $V_2$ | $h_2$ |
| $V_3$ | $h_3$ |
| $V_4$ | $h_4$ |
| ... | ... |
| ... | ... |
| $V_N$ | $h_N$ |

According to some embodiments of the invention, a method of providing a digitized noise signal includes providing a tunnel diode and applying a bias voltage to the tunnel diode for providing a tunneling current signal that includes quantum shot noise. The method also includes converting the current signal to a voltage signal, and converting the voltage signal into the sequence of digitized noise signals that represents random bits.

In some embodiments of the above method, the method also includes estimating the entropy of the sequence of digital noise signals and adjusting the bias voltage to the tunnel diode according to the entropy.

In some embodiments, the method also includes generating a lookup table listing tunnel diodes bias voltage versus estimated entropy of the sequence of digital signals. For example, the lookup table can be generated in the factory, and the table can be used during system startup to verify the functionality of the system.

In some embodiments of the above method, the method also includes applying health test algorithms to the sequence of digital noise signals and adjusting the bias voltage to the tunnel diode according to the health test results.

In some embodiments, the method also includes generating a lookup table listing tunnel diodes bias voltage versus health test results of the sequence of digital signals. For example, the lookup table can be generated in the factory, and the table can be used during system startup to verify the functionality of the system.

Figure 7:
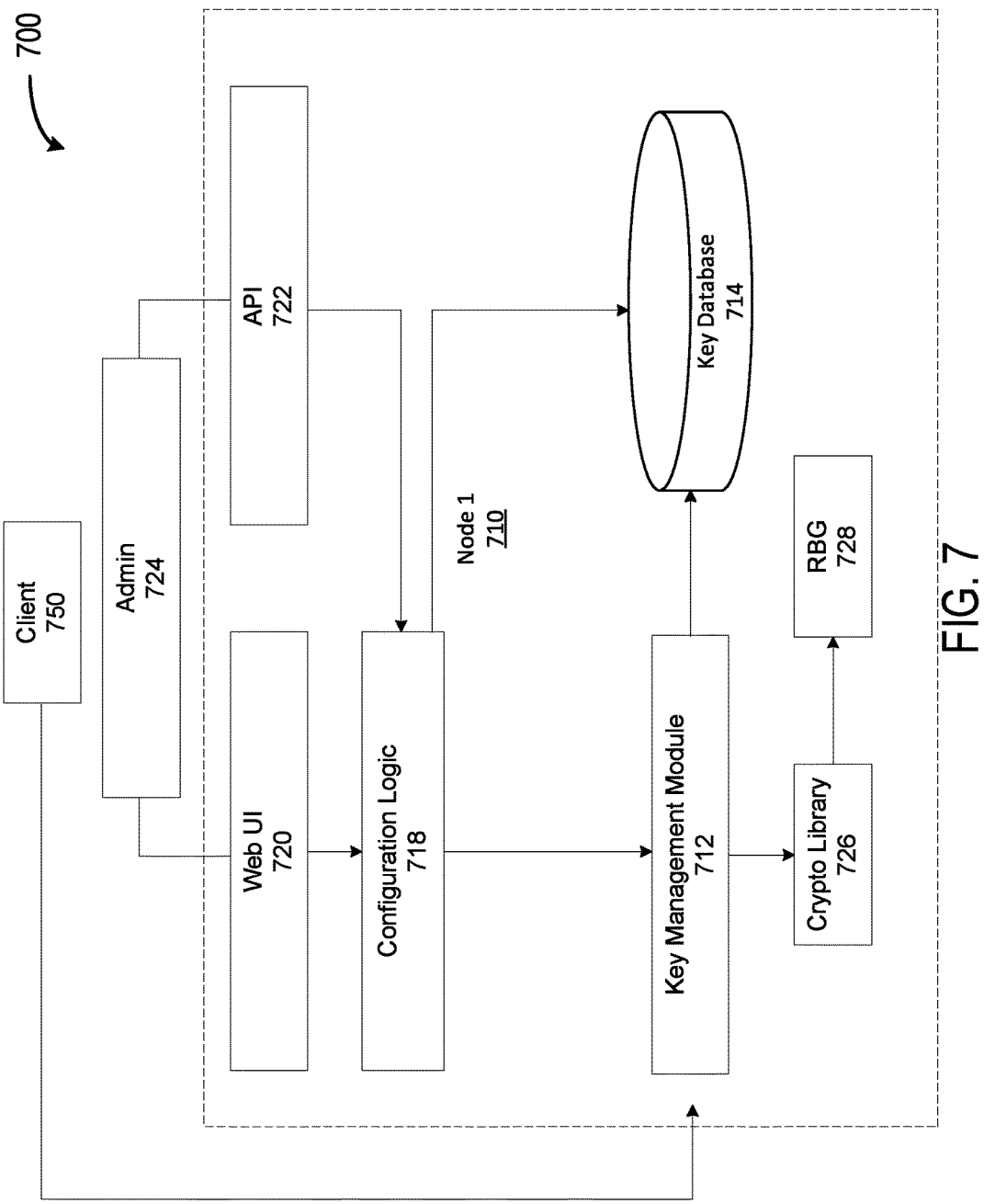
FIG. 7 is a simplified block diagram illustrating a cryptographic key management system according to some embodiments of the invention.

FIG. 7 is a simplified block diagram illustrating a key management system 700. The random number generator described above can be part of a key management system and can be used for generating key material, such as random numbers, for the key management system. FIG. 7 illustrates an example of a key management system. The node 1 (710) can include a key management module 712 and a key database 714. The key management module 712 can perform operations on the key database 714. The key management module 712 can communicate with the key database 714. In some examples, the key management module 712 can communicate with a key database module in a different node.

The node 1 (710) can further include a configuration logic module 718, a web UI 720, and an API 722. The configuration logic module 718 can coordinate operations on key database 714. And both the web UI 720 and the API 722 can communicate with the configuration logic module 718. In some examples, an admin 724 can communicate with the web UI 720 and the API 722. In such examples, the admin 724 can include external administrator software to communicate with the configuration logic module 718. The external administrator software can set up and configure the key database 714 by communicating with the configuration logic module 718, or any configuration logic module 718 in the cluster. In some examples, the admin 724 can use the web UI 720 or the API 722 to communicate with the configuration logic module 718.

A client 750 can communicate with the node 1 (710) using the key management module 712. In some examples, the client 750 can include client software to access a key database by interfacing with a key management module in any node in a cluster. In addition, an administrator connected to a node can be able to initiate operations on a database on any nodes in the cluster. In addition, via a configuration logic module, the administrator can initiate operations on database instances, including create, destroy, start, stop, and reconfigure. In certain embodiments, key management system 700 in FIG. 7 may be implemented use one or more components disclosed in FIG. 8.

The node 1 (710) can further include a crypto library 726 and a random bit generator 728. A well-constructed random bit generator can contain an entropy source 100, which in turn contains a digitized noise source (300). The random bit generator 728 can generate a sequence of full-entropy random bits that can be used by the key manager.

A client 750 can request the creation of a new key in node 1 (710). The client can send the key management module 712 a key creation request, which can for example include the following properties: operation (e.g. create); type (e.g. key); algorithm (e.g. Triple DES), length (e.g. 168). A corresponding key request can then be sent to the crypto library (726). In order to generate the requested key type, the crypto library can request the required number of random bits from the random bit generator (728). The created key is then passed back to the key manager module (712). The key management module can create a corresponding unique key identification number. The created key can be stored in the key database (714) and the key ID can be returned to the client (750).

Figure 8:
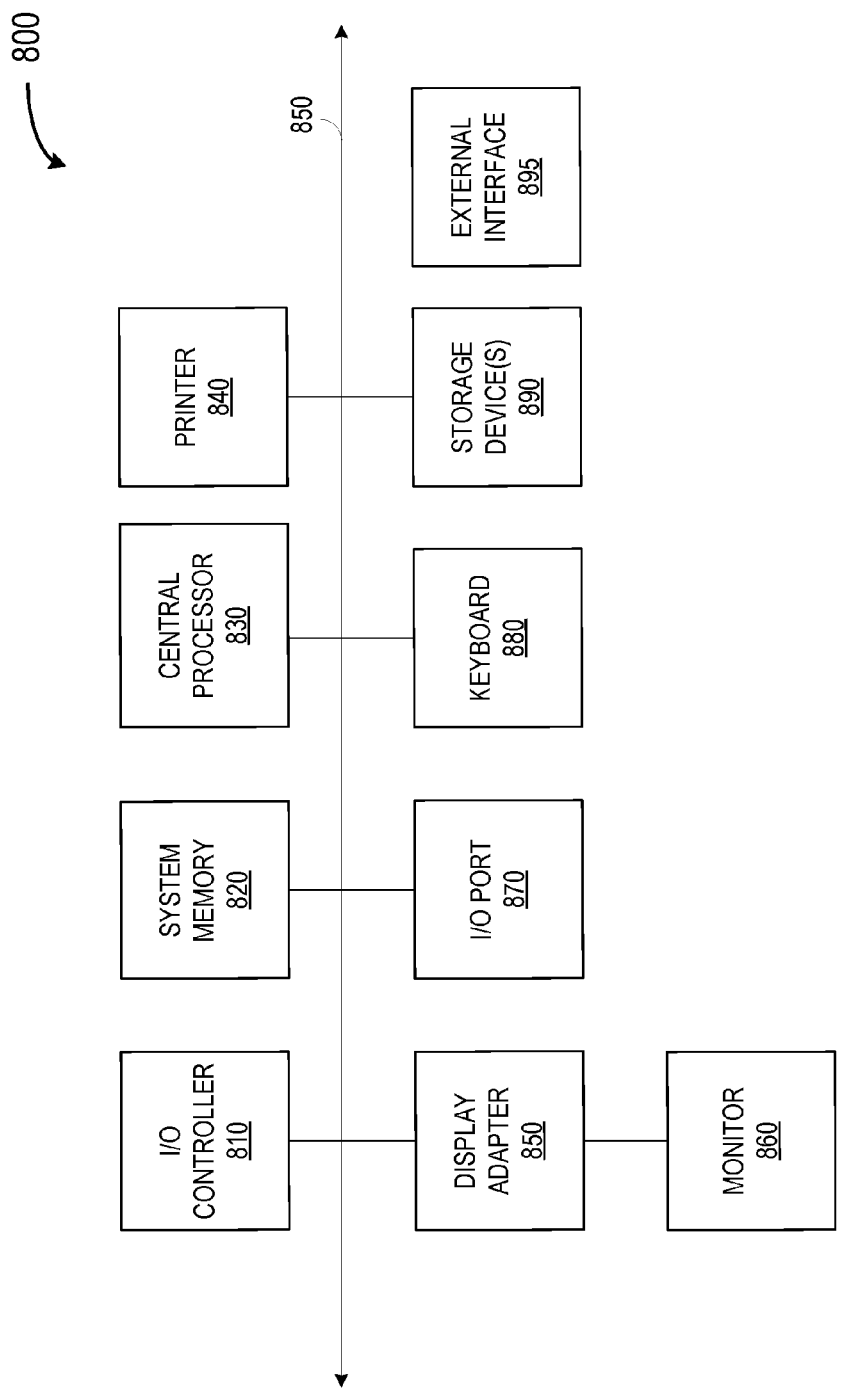
FIG. 8 is a simplified block diagram illustrating an example of a computer system according to some embodiments of the invention.

FIG. 8 is a simplified block diagram illustrating an example of a computer system. Any of the computer systems mentioned herein may utilize any suitable number of subsystems. Examples of such subsystems are shown in FIG. 8 in computer system 800. In some embodiments, a computer system includes a single computer apparatus, where the subsystems can be the components of the computer apparatus. In other embodiments, a computer system can include multiple computer apparatuses, each being a subsystem, with internal components.

The subsystems shown in FIG. 8 are interconnected via a system bus 850. Additional subsystems such as a printer 840, keyboard 880, storage device(s) 890, monitor 860, which is coupled to display adapter 850, and others are shown. Peripherals and input/output (I/O) devices, which couple to I/O controller 810, can be connected to the computer system by any number of means known in the art such as input/output (I/O) port 870 (e.g., USB, FireWire®). For example, I/O port 870 or external interface 81 (e.g. Ethernet, Wi-Fi, etc.) can be used to connect computer system 800 to a wide area network such as the Internet, a mouse input device, or a scanner. The interconnection via system bus 850 allows the central processor 830 to communicate with each subsystem and to control the execution of instructions from system memory 820 or the storage device(s) 890 (e.g., a fixed disk, such as a hard drive or optical disk), as well as the exchange of information between subsystems. The system memory 820 and/or the storage device(s) 890 may embody a computer readable medium. Any of the data mentioned herein can be output from one component to another component and can be output to the user.

A computer system can include a plurality of the same components or subsystems, e.g., connected together by external interface 895 or by an internal interface. In some embodiments, computer systems, subsystems, or apparatuses can communicate over a network. In such instances, one computer can be considered a client and another computer a server, where each can be part of a same computer system. A client and a server can each include multiple systems, subsystems, or components.

In the foregoing specification, aspects of this disclosure are described with reference to specific embodiments thereof, but those skilled in the art will recognize that this disclosure is not limited thereto. Various features and aspects of the above-described disclosure may be used individually or jointly. Further, embodiments can be utilized in any number of environments and applications beyond those described herein without departing from the broader spirit and scope of the specification. The specification and drawings are, accordingly, to be regarded as illustrative rather than restrictive.

In the foregoing description, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor or logic circuits programmed with the instructions to perform the methods. These machine-executable instructions may be stored on one or more machine readable mediums, such as CD-ROMs or other type of optical disks, floppy diskettes, ROMs, RAMs, EPROMs, EEPROMs, magnetic or optical cards, flash memory, or other types of machine-readable mediums suitable for storing electronic instructions. Alternatively, the methods may be performed by a combination of hardware and software.

Where components are described as being configured to perform certain operations, such configuration can be accomplished, for example, by designing electronic circuits or other hardware to perform the operation, by programming programmable electronic circuits (e.g., microprocessors, or other suitable electronic circuits) to perform the operation, or any combination thereof.

While illustrative embodiments of the application have been described in detail herein, it is to be understood that the inventive concepts may be otherwise variously embodied and employed, and that the appended claims are intended to be construed to include such variations, except as limited by the prior art.

What is claimed is:

1. A random number generator for generating random numbers, comprising:
    a digitized noise source for producing a sequence of random digital signals, comprising:
        a tunnel diode for providing a current signal that includes quantum shot noise properties;
        a bias voltage for biasing the tunnel diode and generating a current signal;
        a current-to-voltage converter coupled to the tunnel diode for converting the current signal to a voltage signal;
        a filtering and amplification circuit coupled to the current-to-voltage converter for producing an amplified voltage signal; and
        a digitization circuit for converting the amplified voltage signal into a sequence of digital signals that represents random bits;
    an entropy estimator coupled to an output of the digitization circuit for estimating an entropy of the sequence of digital signals;
    a health checker coupled to the entropy estimator for determining if the digitized noise source meets performance specification;
    a controller logic coupled to the entropy estimator and health checker for storing a lookup table that contain the tunnel diodes bias voltage versus estimated entropy and tunnel diodes bias voltage versus health test results of the sequence of digital signals; and
    a feedback path for providing a feedback bias voltage to adjust the current signal from the tunnel diode based on the estimated entropy and the health tests, wherein the feedback bias voltage is determined according to the lookup table.

2. The random number generator of claim 1, wherein the health checker determines if the noise source meets the performance specification by comparing the estimate of the entropy from the entropy estimator against a lookup table.

3. The random number generator of claim 1, wherein the health checker provides bias voltage feedback to the diode based on the lookup table based on determining that the noise source does not meet performance specification.

4. The random number generator of claim 1, wherein the lookup table is generated in a factory and pre-loaded in the noise source.

5. The random number generator of claim 1, wherein the entropy estimator comprises a min entropy estimator.

6. The random number generator of claim 1, wherein the tunnel diode comprises a semiconductor device having a doped PN junction and configured to conduct current by quantum mechanical tunneling.

7. The random number generator of claim 1, wherein a bias voltage of less than 100 mV is applied to the tunnel diode for generating random numbers.

8. The random number generator of claim 1, wherein the current-to-voltage converter comprises a variable DC voltage source.

9. The random number generator of claim 1, wherein the current-to-voltage converter comprises a constant DC voltage source and a variable resistor.

10. A digitized noise source device for producing a sequence of random digital signals, comprising:
   a tunnel diode for providing a current signal that includes quantum shot noise;
   a current-to-voltage converter coupled to the tunnel diode for converting the current signal to a voltage signal;
   a filtering and amplification circuit coupled to the current-to-voltage converter for producing an amplified voltage signal; and
   a digitization circuit including an analogue-to-digital converter (ADC) for converting the amplified voltage signal into multiple level digital signals that represent a sequence of random bits, wherein each level represents more than one random bit.

11. The device of claim 10, further comprising an entropy estimator coupled to the output of the digitization circuit for providing a feedback bias voltage to the tunnel diode.

12. A digitized noise source device for producing a sequence of random digital signals, comprising:
   a tunnel diode for providing a current signal that includes quantum shot noise;
   a current-to-voltage converter coupled to the tunnel diode for converting the current signal to a voltage signal;
   a filtering and amplification circuit coupled to the current-to-voltage converter for producing an amplified voltage signal;
   a digitization circuit for converting the amplified voltage signal into digital signals that represent a sequence of random bits;
   a lookup table listing tunnel diodes bias voltage versus estimated entropy of the sequence of digitized signal, wherein the tunnel diode bias voltage is determined according to the lookup table.

13. A noise source device for producing a sequence of random digital signals comprising:
   a tunnel diode configured with a bias voltage between 0 V and 60 mV for providing a current signal that includes quantum shot noise;
   a current-to-voltage converter coupled to the tunnel diode for applying the bias voltage to the tunnel diode and for converting the current signal to a voltage signal, and
   a digitization circuit for converting the voltage signal into a sequence of digitized random signal.

14. The device of claim 13, further comprising an entropy estimator for estimating an entropy of the sequence of digitized random signal and adjusting the bias voltage to the tunnel diode according to the entropy.

15. The device of claim 14, further comprising a lookup table listing tunnel diodes bias voltage versus estimated entropy of the sequence of digitized random signal.

16. A method of providing a digitized noise signal, comprising:
   providing a tunnel diode;
   applying a bias voltage to the tunnel diode for providing a tunneling current signal that includes quantum shot noise;
   converting the current signal to a voltage signal;
   converting the voltage signal into a sequence of digitized noise signals that represents random bits; and
   generating a lookup table listing tunnel diode bias voltage versus estimated entropy of the sequence of digitized noise signals,
   wherein the bias voltage to the tunnel diode is determined according to the lookup table.

17. The method of claim 16, further comprising estimating the entropy of the sequence of digitized noise signals and adjusting the bias voltage to the tunnel diode according to the entropy.

* * * * *